(12) United States Patent
Kozuru et al.

(10) Patent No.: US 10,566,760 B2
(45) Date of Patent: Feb. 18, 2020

(54) LIGHT EMITTING DEVICE

(71) Applicant: NICHIA CORPORATION, Anan-shi, Tokushima (JP)

(72) Inventors: Kazuma Kozuru, Tokushima (JP); Soichiro Miura, Tokushima (JP); Tatsuya Kanazawa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 134 days.

(21) Appl. No.: 15/939,901

(22) Filed: Mar. 29, 2018

(65) Prior Publication Data

US 2018/0287335 A1 Oct. 4, 2018

(30) Foreign Application Priority Data

Mar. 30, 2017 (JP) .................................. 2017-067374

(51) Int. Cl.
| | |
|---|---|
| *H01S 5/022* | (2006.01) |
| *H01S 5/30* | (2006.01) |
| *H01S 5/40* | (2006.01) |
| *H01S 5/00* | (2006.01) |
| *H01S 5/024* | (2006.01) |

(52) U.S. Cl.
CPC ...... *H01S 5/02216* (2013.01); *H01S 5/02296* (2013.01); *H01S 5/3013* (2013.01); *H01S 5/0071* (2013.01); *H01S 5/02276* (2013.01); *H01S 5/02288* (2013.01); *H01S 5/02469* (2013.01); *H01S 5/4025* (2013.01)

(58) Field of Classification Search
CPC ............ H01S 5/02216; H01S 5/02288; H01S 5/02296; H01S 5/4025–426; H01S 5/02208; H01S 5/02212; H01S 5/02248
See application file for complete search history.

(56) References Cited

U.S. PATENT DOCUMENTS

| | | | | |
|---|---|---|---|---|
| 5,784,396 | A * | 7/1998 | Guerin | H01S 5/423 257/80 |
| 10,218,151 | B1* | 2/2019 | Hwang | H01S 5/0226 |
| 10,415,794 | B2* | 9/2019 | Kiyota | F21V 5/04 |
| 2004/0223532 | A1* | 11/2004 | Shinohara | H01S 5/02288 372/92 |
| 2005/0078720 | A1* | 4/2005 | Walker, Jr. | H01S 5/02288 372/36 |

(Continued)

FOREIGN PATENT DOCUMENTS

| | | |
|---|---|---|
| JP | H11-014876 A | 1/1999 |
| JP | 2000-131583 A | 5/2000 |

(Continued)

*Primary Examiner* — Joshua King
(74) *Attorney, Agent, or Firm* — Foley & Lardner LLP (57) ABSTRACT

A light emitting device includes a base, a frame, one or more semiconductor laser elements, a cover member, an optical member fixed to the cover member via an adhesive member, and a pressing member. The adhesive member includes one or more first adhesive portion disposed between an upper surface of the cover member and a lower surface of the optical member, and two or more second adhesive portions respectively disposed at locations in contact with or spaced apart from the one or more first adhesive portions when viewed from above, in contact with the first inner lateral surface of the cover member and the lateral surface of the optical member.

11 Claims, 9 Drawing Sheets

(56) References Cited

U.S. PATENT DOCUMENTS

| | | | | |
|---|---|---|---|---|
| 2006/0077640 A1* | 4/2006 | Yoshikawa | ............. | H01L 31/12 361/752 |
| 2007/0176274 A1* | 8/2007 | Yoneda | ............... | H01L 23/3185 257/680 |
| 2009/0129420 A1* | 5/2009 | Regaard | ................ | H01S 5/4012 372/50.12 |
| 2010/0246159 A1* | 9/2010 | Wada | ........................ | F21K 9/00 362/84 |
| 2012/0039072 A1* | 2/2012 | Lell | ...................... | H04N 9/3129 362/227 |
| 2012/0091500 A1* | 4/2012 | Matoba | ................. | H01L 33/486 257/99 |
| 2013/0003764 A1* | 1/2013 | Kress | .................. | H01S 5/02264 372/35 |
| 2013/0272329 A1* | 10/2013 | Auen | ..................... | H01S 5/024 372/34 |
| 2014/0197528 A1* | 7/2014 | Nagata | .................... | H01L 33/58 257/680 |
| 2015/0003482 A1* | 1/2015 | Monadgemi | ........ | H01S 5/02292 372/44.01 |
| 2015/0270682 A1* | 9/2015 | Daniels | .............. | G03B 21/2066 353/99 |
| 2016/0123561 A1* | 5/2016 | Chern | .................... | G02B 27/48 362/230 |
| 2016/0126704 A1* | 5/2016 | Horn | ..................... | H01S 5/4025 362/84 |
| 2017/0122505 A1* | 5/2017 | Kiyota | ................ | H01S 5/02276 |
| 2017/0317467 A1* | 11/2017 | Miura | ................. | H01S 5/02252 |
| 2018/0182928 A1* | 6/2018 | Namie | ..................... | H01L 33/62 |
| 2019/0121141 A1* | 4/2019 | Dykaar | ................ | H04N 9/3161 |

FOREIGN PATENT DOCUMENTS

| | | | |
|---|---|---|---|
| JP | 2008015036 A | * | 1/2008 |
| JP | 2016-092268 A | | 5/2016 |

* cited by examiner

LIGHT EMITTING DEVICE

CROSS-REFERENCE TO RELATED PATENT APPLICATION

The present application claims priority under 35 U.S.C. § 119 to Japanese Patent Application No. 2017-067374, filed Mar. 30, 2017. The contents of this application are incorporated herein by reference in their entirety.

BACKGROUND

The present disclosure relates to a light emitting device.

Light source devices in which an optical member is fixed to a cover member via an ultraviolet curable adhesive member have been proposed (for example, see Japanese Patent Application Publication No. 2016-092268, FIG. 1).

SUMMARY

In the light source device described in Japanese Patent Application Publication No. 2016-092268, when the adhesion between the optical member and the cover member is lost due to occurrence of breaking of the ultraviolet curable adhesive member or separation of the ultraviolet curable adhesive member from the optical member or the cover member, the optical member may become separated, which may lead to a failure in obtaining a desired optical characteristics.

A light emitting device according to certain embodiments of the present invention includes: a base having an upper surface; a frame having an upper surface and defining a through-opening and being fixed to the upper surface of the base; one or more semiconductor laser elements fixed to the upper surface of the base inward of the frame; a cover member fixed to the upper surface of the frame to cover the through-opening of the frame to allow light from the one or more semiconductor laser elements to pass through; an optical member fixed to the cover member via an adhesive member to allow light that passed through the cover member to pass through; and a pressing member pressing the optical member to the frame. The cover member has an upper surface located above the upper surface of the frame, a first inner lateral surface located inward of the frame and extends downward from the upper surface, and a first upward-facing surface extending inward from the first inner lateral surface. The adhesive member includes one or more first adhesive portions and two or more second adhesive portions. The one or more first adhesive portions are located between the upper surface of the cover member and the lower surface of the optical member. The two or more second adhesive portions are, when viewed from above, in contact with the first adhesive portions or located spaced apart from the first adhesive portions, and respectively in contact with the first inner lateral surface of the cover member and the lateral surface of the optical member, to limit shifting of the optical member in a lateral direction upon occurrence of a loss of adhesion between the optical member 70 and the cover member 60.

With the configuration described above, even when the adhesion between the optical member and the cover member is lost, occurrence of detachment of the optical member or positional shifting of the optical member can be reduced.

DETAILED DESCRIPTION

Certain embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in the drawings are occasionally shown exaggerated for ease of explanation.

First Embodiment

A light emitting device 100 includes: a base 11 having an upper surface; a frame 12 having an upper surface and defining a through-opening and being fixed on the upper surface of the base 11; one or more semiconductor laser elements 20 disposed inward of the frame 12 and fixed to the upper surface of the base 11; a cover member 60 fixed to the upper surface of the frame 12 to cover the through-opening of the frame 12, to allow light from the one or more semiconductor laser elements 20 to pass through, an optical member 70 fixed to the cover member 60 via an adhesive member 80 to allow light that passed through the cover member 60 to pass through; and a pressing member 90 pressing the optical member 70 to the frame 12. The cover member 60 has an upper surface 60a located above the upper surface of the frame 12, a first inner lateral surface 60b located inward of the frame 12 and extends downward from the upper surface 60a, and a first upward-facing surface 60c extending inward from the first inner lateral surface 60b. The adhesive member 80 includes one or more first adhesive portions 81 and two or more second adhesive portions 82. The one or more first adhesive portions 81 are located between the upper surface 60a of the cover member 60 and the lower surface of the optical member 70. The two or more second adhesive portions 82 are, when viewed from above, in contact with the first adhesive portions 81 or located spaced apart from the first adhesive portions 81, and respectively in contact with the first inner lateral surface 60b of the cover member 60 and the lateral surface of the optical member 70, to limit shifting of the optical member 70 in a lateral direction upon occurrence of a loss of adhesion between the optical member 70 and the cover member 60.

Accordingly, in the light emitting device 100, detachment or locational shift of the optical member 70 can be reduced. More details thereof will be described below.

In a conventional light emitting device, the optical member is generally fixed to the cover member via an adhesive member, but a long-time operation under a high temperature due to heat generated in operation may cause breaking of the adhesive member between the optical member and the cover member, or detachment of the adhesive member from the optical member or from the cover member, which may lead to a loss of adhesion between the optical member and the cover member. In such a case, separation of the optical member may likely occur, resulting in a failure to obtain desired optical characteristics. Accordingly, in the first embodiment, the optical member is pressed by the pressing member so that detachment of the optical member can be inhibited even upon occurrence of a loss of adhesion between the optical member and the cover member.

Further, even when the detachment of the optical member is inhibited with the use of the pressing member, in condition that the adhesion between the cover member and the optical member is lost, the optical member may shift in a lateral direction (shift or rotate in an X-Y plane), which may lead to a failure to obtain desired optical characteristics. Accordingly, in the first embodiment, the light emitting device 100 includes the adhesive member 80 and the pressing member 90 pressing the optical member 70 to the frame 12. When viewed from above, the adhesive member 80 includes the first adhesive portion 81 disposed at certain portions between the upper surface 60a of the cover member 60 and the lower surface of the optical member 70, and the two or more second adhesive portions 82 disposed in contact with the first inner lateral surface 60b of the cover member 60 and the lateral surface of the optical member 70. Upon occurrence of a loss of adhesion between the cover member 60 and the optical member 70, in many cases, the adhesive member 80 has been broken or detached along the periphery of the optical member 70 and/or the periphery of the cover member 60. Accordingly, in the first embodiment, each of the second adhesive portions 82 is disposed connecting a portion of the lateral surface of the optical member 70 and a portion of the first inner lateral surface 60b of the cover member 60. With this arrangement, even if the adhesion between the cover member 60 and the optical member 70 is lost, for example, most of the second adhesive portion 82 may still adhered to the lateral surface of the optical member 70 and a portion of the second adhesive portion 82 may still be adhered to the first inner lateral surface 60b of the cover member 60. Thus, the first adhesive portion 82 and the second adhesive portion 82 can interfere with each other in a movement in a lateral direction, which can reduce positional shifting of the optical member 70. Thus, even in the case where a loss of adhesion between the cover member 60 and the optical member 70 occurs, which may lead to separation of the optical member 70 from the cover member 60, separation of the optical member 70 or positional shifting of the optical member 70 can be inhibited.

The components of the light emitting device body 100 will be described below.

Substrate 10

A substrate 10 has the base 11 having an upper surface and the frame 12 fixed on the upper surface of the base 11. In the first embodiment, a main component of the base 11 is copper and a main component of the frame 12 is iron. With the use of a material having a relatively high thermal conductivity for the base 11, dissipation of the heat from the semiconductor laser elements 20 can be facilitated. Meanwhile, when a material having a relatively low thermal conductivity is used for the frame 12, the cover member 60 and the frame 12 can be fixed by welding, hermetically sealing of space between the cover member 60 and the substrate 10 can be facilitated. Thus, the base 11 and the frame 12 are preferably made of different materials, but the base 11 and the frame 12 may be made of the same material.

Figure 5A:
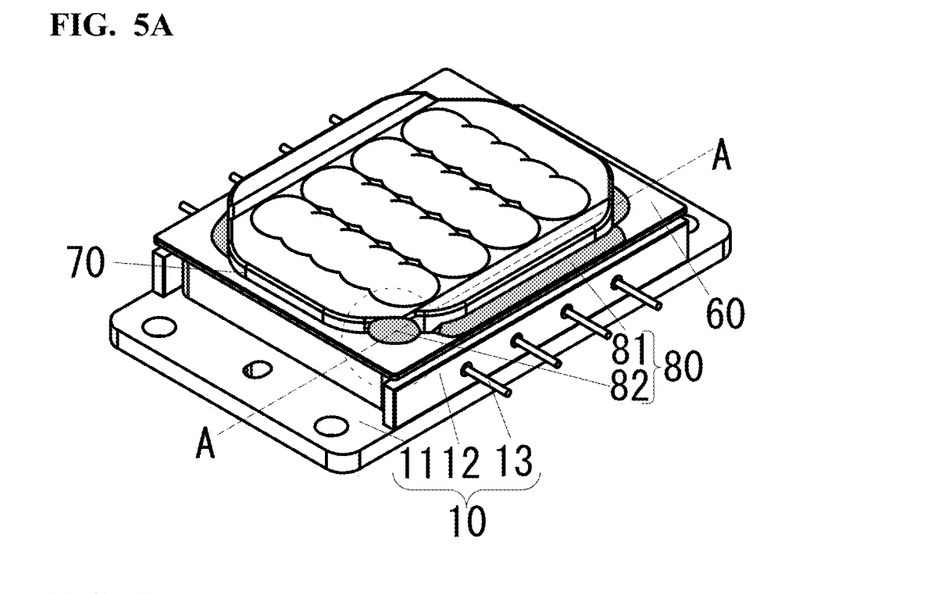
FIG. 5A is a schematic perspective view of the light emitting device shown in FIG. 1, in which a pressing member is not shown.
Figure 5B:
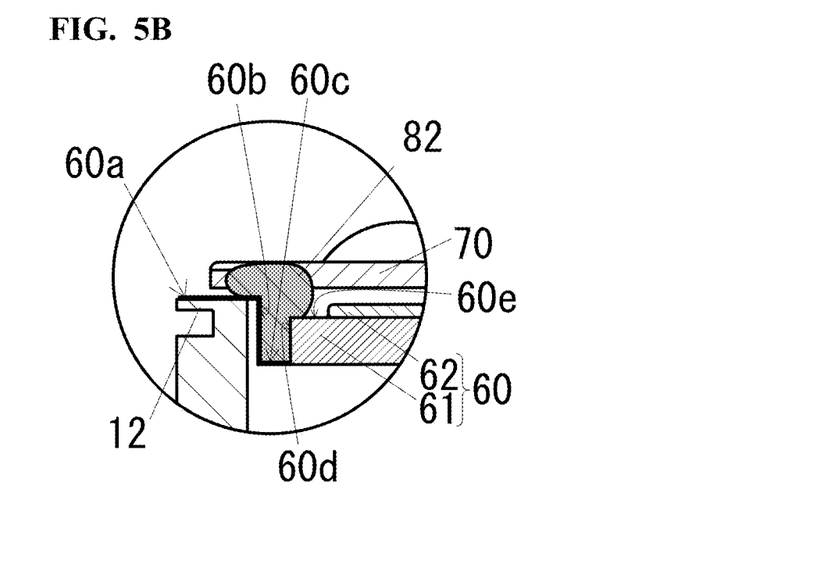
FIG. 5B is an enlarged schematic cross-sectional view of a part enclosed by a dotted line, taken along line A-A of FIG. 5A.

In the first embodiment, as shown in FIG. 5A and FIG. 5B, the frame 12 has its upper portion bent outward. With this arrangement, stress between the frame 12 and the cover member 60 can be reduced, and also durability of airtightness can be improved. Moreover, as shown in FIG. 1, the pressing member 90 can be held hooked to the portion bent outward.

In the first embodiment, the base 11 has a rectangular shape elongated in one direction when viewed from above. The frame 12 has a rectangular shape with a through-opening defined by a rectangular periphery elongated in the same direction as in the base 11. When viewed from above, an end of one lateral wall corresponding to the long side defining the through-opening of the frame 12 is preferably protruded from one lateral wall corresponding to the short side defining the through-opening of the frame 12. With this arrangement, at each of four end portions of short-side lateral walls of the frame 12, a portion of the pressing member 90 is abutted to one end portion of the short-side lateral wall and to one end portion of the long-side lateral wall of the frame 12, so that a shift of the pressing member 90 in a short-side direction can be limited, and thus facilitate reduction in the positional shifting of the pressing member 90.

Figure 1:
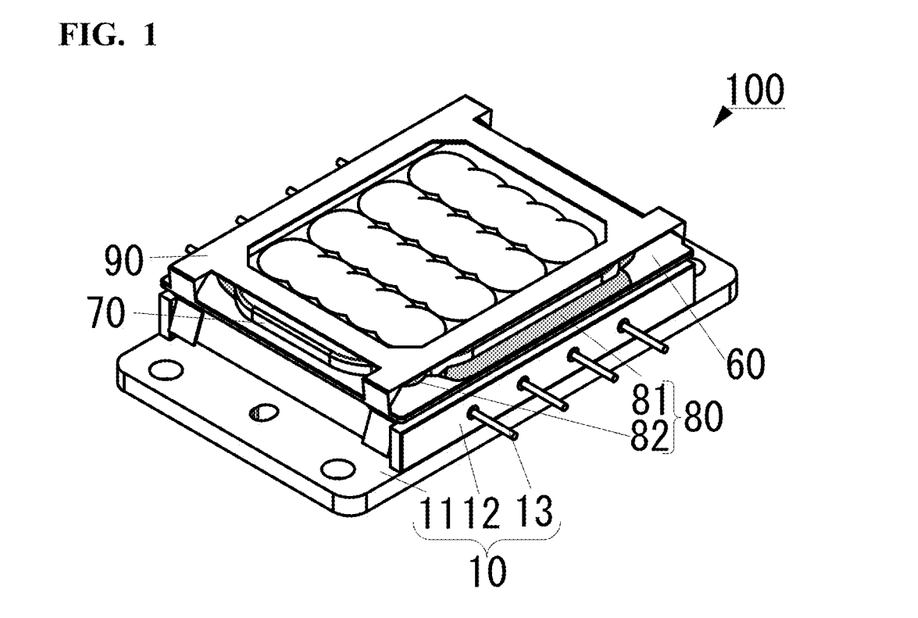
FIG. 1 is a schematic perspective view of a light emitting device according to a first embodiment of the present invention.
Figure 2:
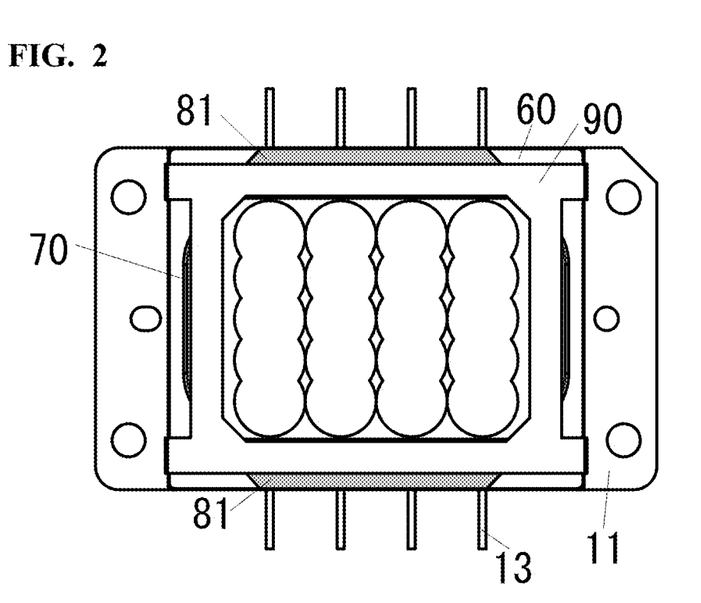
FIG. 2 is a schematic top view of the light emitting device shown in FIG. 1.
Figure 3:
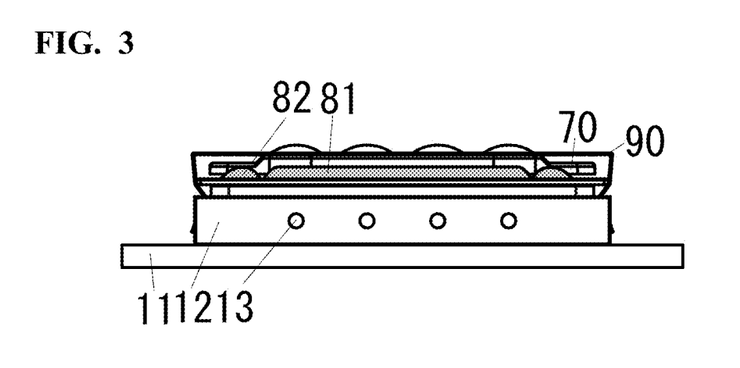
FIG. 3 is a schematic side view of the light emitting device shown in FIG. 1.
Figure 4:
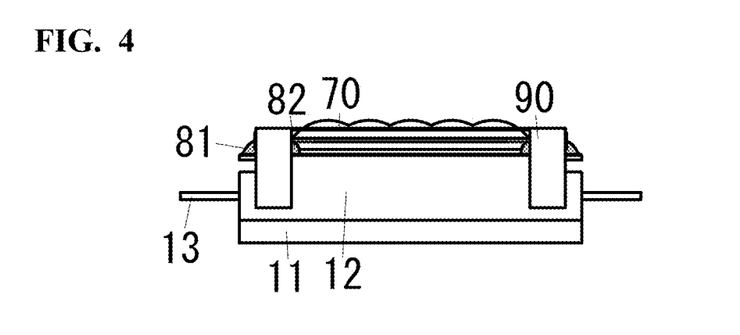
FIG. 4 is a schematic view of another side of the light emitting device shown in FIG. 1.

As shown in FIG. 1, among the four lateral walls of the frame 12, through-holes are provided in two opposite long-side walls. and lead pins 13 for establishing electrical connection to the outside are inserted through the through-holes and fixed to plug the through-holes.

Semiconductor Laser Element 20

Figure 7:
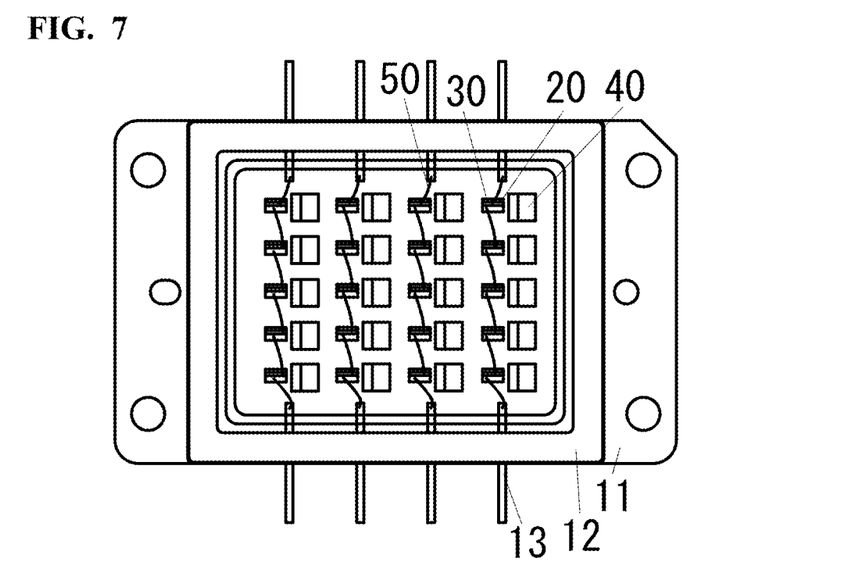
FIG. 7 is a schematic top view of the light emitting device shown in FIG. 1, in which the pressing member, the optical member, and the cover member are not shown.

In the first embodiment shown in FIG. 7, a plurality of semiconductor laser elements 20 are fixed to the upper surface of the base 11 in a region inward of the frame 12. In this case, a large quantity of heat is conducted to the base 11, which increases the amount of warpage of the base 11 due to the difference in the thermal expanding coefficient between the base 11 and the frame 12, which correspondingly may read to breaking and/or detachment of the adhesive member 80, which further resulting in loss of physical adhesion between the optical member 70 and the cover member 60 through the adhesive member 80. Even in such a case, separation and/or positional shifting of the optical member 70 in the light emitting device 100 can be reduced. In the first embodiment, the semiconductor laser elements 20 are arranged in 5 rows and 4 columns.

In the first embodiment, the laser light emitted from each of the semiconductor laser elements 20 is directed to the light-reflecting member 40 and reflected by the light-reflecting member 40 toward the cover member 60. Thus, a main surface that is a lateral surface adjacent to the light emitting surface of each of the semiconductor laser elements 20 can be arranged facing the upper surface of the base 11, which can facilitate dissipation of heat from the semiconductor laser elements 20 to the base 11. For the light-reflecting member 40, for example, a material having a high thermal conductivity such as quartz glass provided with a light-reflecting film can be used.

In the first embodiment, each of the semiconductor laser elements 20 is fixed to the upper surface of the base 11 via a sub-mount 30. Accordingly, the distance between the active layer of the semiconductor laser element 20 and the upper surface of the base 11 can be increased, so that possibility of the laser light emitted from the semiconductor laser element 20 hitting the base 11 can be reduced.

In the first embodiment, semiconductor laser elements 20 made of nitride semiconductors are employed. The semiconductor laser elements 20 made of nitride semiconductors have relatively high outputs, which attract dust to the light-transmissive portion 62 of the cover member 60. In the first embodiment, the adhesive member 80 is disposed at certain portions between the optical member 70 and the cover member 60 and the space formed by the optical member 70 and the cover member 60 is not hermetically sealed. The nitride semiconductors may be Group III-V compound semiconductors such as $Al_xIn_yGa_{1-x-y}N$ ($0 \leq x \leq 1$, $0 \leq y \leq 1$, $0 \leq x+y \leq 1$).

In the first embodiment, in a column direction, two adjacent semiconductor laser elements 20 are electrically connected by a wire 50. As shown in FIG. 7, each of the semiconductor laser elements 20 at the first row and the fifth row is electrically connected to an adjacent lead pin 13 by a wire 50.

Cover Member 60

Figure 8:
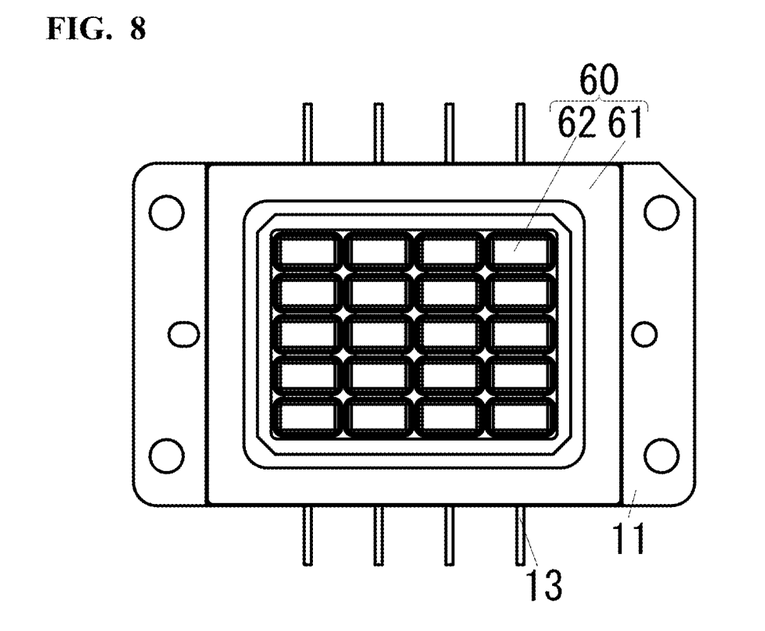
FIG. 8 is a schematic top view of the light emitting device shown in FIG. 1, in which the pressing member and the optical member are not shown.

As shown in FIG. 8, the cover member 60 is fixed to the upper surface of the frame 12 to cover the through-opening of the frame 12. In the first embodiment, the cap 60 includes a support part 61, a plurality of through-openings defined in the support part 61, and a plurality of light-transmissive part 62 each covering one of the plurality of through-openings. In the present embodiment, a material whose main component is iron is used for the supporting part 61, thus, welding of the cap 60 to the frame 12 can be facilitated.

As shown in FIG. 5B, the cover member 60 has the upper surface 60a located above the upper surface of the frame 12, the first inner lateral surface 60b located inward of the frame 12 and extends downward from the upper surface 60a, and the first upward-facing surface 60c extending inward from the first inner lateral surface 60b. In the first embodiment, the cover member 60 further includes the second inner lateral surface 60d extends upward from the first upward-facing surface 60c, and the second upward-facing surface 60e extending inward from the second inner lateral surface 60d. The cover member 60 defines a recess with the first inner lateral surface 60b, the first upward-facing surface 60c, and the second inner lateral surface 60d. With the second inner lateral surface 60d provided in the cover member 60, excessive spreading of the second adhesive portion 82 of the adhesive member 80 can be inhibited, which can facilitate placing the second adhesive portion 82 without covering the light-transmissive portion 62. Further, the second adhesive portion 82 of the adhesive member 80 is made in contact with both the first inner lateral surface 60b and the second inner lateral surface 60d, which can hinder the adhesive member 80 from sliding out in the upward direction in FIG. 5A.

In the first embodiment, the second upward-facing surface 60e is located lower than the upper surface 60a. Accordingly, as in the first embodiment, when the light-transmissive portion 62 is fixed to the upper surface of the second upward-facing surface 60e, the light-transmissive portion 62 can be inhibited from coming in contact with the optical member 70. The light-transmissive portion 62 may be fitted in each of the through-openings of the cover member 60, instead of fixed to the upper surface of the frame 12.

Optical Member 70

The optical member 70 is fixed to the cover member 60 via the adhesive member 80 and is configured to allow light passing through the cover member 60 to pass through. In the first embodiment, the optical member 70 includes a plurality of lens portions respectively arranged corresponding to the plurality of semiconductor laser elements 20 so that light passing through the light-transmissive portion 62 of the cover member 60 passes through the lens of each of the optical members 70. That is, the optical member 70 has a plurality of lenses that are arranged so that light emitted from a single semiconductor laser element 20 passes through a single lens. When a plurality of semiconductor laser elements 20 and a plurality of lenses are employed, positional shift, particularly due to rotational misalignment of the optical member 70, may largely affect the emitting direction of the laser light. Thus, the effect of restricting positional shift of the optical member 70 obtained according to the first embodiment can be remarkably exhibited.

Figure 6:
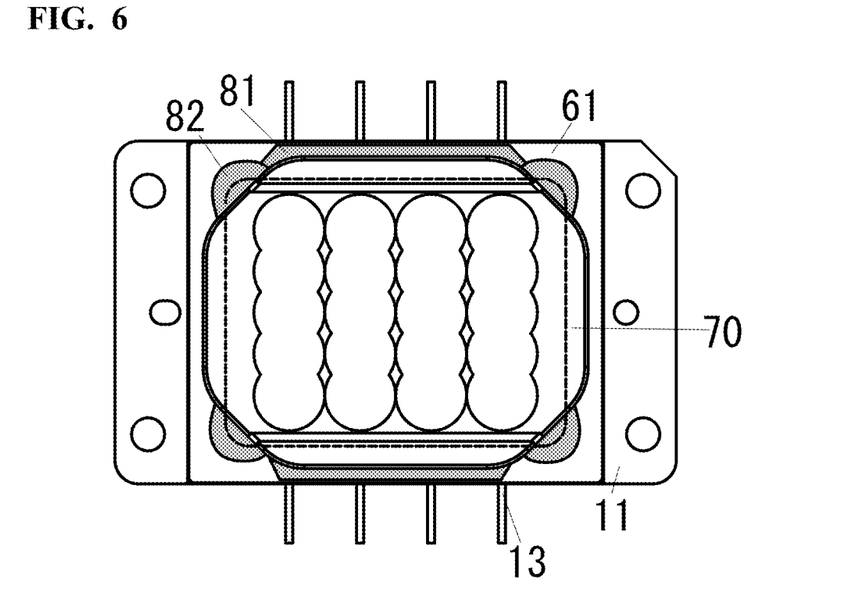
FIG. 6 is a schematic top view of the light emitting device shown in FIG. 1, in which the pressing member is not shown.

In the first embodiment, as shown in FIG. 6, the outer periphery of the optical member 70 includes two opposite long sides and two opposite short sides, and four connecting sides connecting the long sides and the short sides. Further, when viewed from above, the two opposite short sides and the two opposite long sides are located outward of the inner periphery of the cover member 60 that is defined by the upper edge of the first inner lateral surface 60b of the cover member 60, and the four connecting sides are located partially inward of the inner periphery of the cover member 60. The dotted line shown in the FIG. 6 indicates the inner periphery of the cover member 60 defined by the upper end of the first inner lateral surface 60b of the cover member 60. The second adhesive portion 82 of the adhesive member 80 is, as shown in FIG. 5A and FIG. 6, disposed at four locations each being in contact with the lateral surface of the optical member 70 and the first inner lateral surface 60b corresponding to each of the four connecting sides, at portions of the four connecting sides located inward of the inner periphery of the cover member 60. As described above, the outer edge of the optical member 70 is arranged so that certain portions of the outer edge of the optical member 70 are located outward of the inner periphery of the cover member 60 and other portions of the outer edge of are located inward of the inner periphery of the cover member 60. Thus, while reliably providing the certain portions as the regions assigned to dispose the first adhesive portion 81 of the adhesive member 80, the second adhesive portion 82 of the adhesive member 80 can be disposed in the other portions.

As shown in FIGS. 5A and 5B, it is preferable that the optical member 70 has a thickness such that peripheral portions of the long-side are greater than the peripheral portions of the short-sides. As in the first embodiment, in a case where the base 11 has a rectangular shape that is elongated in one direction when viewed from above, heat from the semiconductor laser element 20 tends to cause bending in the base 11, in which the ends of the long sides of the base 11 bent downward. Accordingly, damage to the optical member 70 caused by the warpage of the base 11 can be reduced by increasing the thickness of portions near the lateral surfaces corresponding to the long sides at the outer periphery of the optical member 70, even when the first adhesive portion 81 of the adhesive member 80 is disposed near the lateral surfaces corresponding to the long sides of the optical member 70.

Adhesive Member 80

The adhesive member 80 includes one or more first adhesive portions 81 and two or more second adhesive portions 82. The one or more first adhesive portions 81 are located between the upper surface 60a of the cover member 60 and the lower surface of the optical member 70. The two or more second adhesive portions 82 are, when viewed from above, in contact with the first adhesive portions 81 or located spaced apart from the first adhesive portions 81, and respectively in contact with the first inner lateral surface 60b of the cover member 60 and the lateral surface of the optical member 70, to limit shifting of the optical member 70 in a lateral direction when the bonding of the optical member 70 and the cover member 60 becomes insufficient. In each of the drawings, the adhesive member 80 is painted out to clarify the locations of the adhesive member 80.

When viewed from above, the adhesive member 80 is not disposed along the entire periphery of the optical member 70, but is disposed along certain portions of the periphery of the optical member 70. With this arrangement, gas vaporized from the adhesive member 80 can be released through the regions absent of the adhesive member 80, so that accumulation of organic materials at the light-transmissive portion 62 can be reduced.

In the first embodiment, the first adhesive portion 81 of the adhesive member 80 is disposed in a region outward of the inner periphery of the cover member 60, between the lower surface of the optical member 70 and the upper surface 60a of the cover member 60. As shown in FIGS. 5A and 5B, the first adhesive portion 81 may be disposed to further cover portions of the long-side lateral surfaces of the optical member 70. With this arrangement, a contact area between the adhesive member 80 and the optical member 70 can be increased, and thus, detachment of the adhesive from the optical member 70 can be reduced.

In the first embodiment, the first adhesive portion 81 of the adhesive member 80 is disposed near the long sides of the lower surface of the optical member 70, along the two opposite long sides of the optical member 70. The first adhesive portion 81 of the adhesive member 80 is not provided at and near the two opposite short sides of the optical member 70. With this arrangement, the connecting area of the optical member 70 and the adhesive member 80 can be enlarged, while forming a gap between the optical member 70 and the cover member 60. Accordingly, breaking of the adhesive member 80 can be reduced, and attraction of dust to the light-transmissive portion 62 of the cover member 60 can also be reduced. In order to increase the contact area between the optical member 70, the adhesive member 80, and the cover member 60, in the first embodiment, the first adhesive portion 81 is provided along the opposite long sides of the optical member 70, but alternatively the first adhesive portion 81 may be provided near the opposite short sides of the optical member 70. For the same reason, two first adhesive portions 81 are provided in the first embodiment, but at least one first adhesive portion 81 may be provided.

Further, in the first embodiment, as shown in FIG. 5A, FIG. 5B, and FIG. 6, the second adhesive portion 82 of the adhesive member 80 is in contact with the first inner lateral surface 60b of the cover member 60 and the lateral surface of the optical member 70, at locations inward of the inner periphery of the cover member 60. With this arrangement, even when the adhesive member 80 is broken, a movement of the optical member 70 can be limited by the second adhesive portion 82 that has not been broken and located between the lateral surface of the optical member 70 and the first inner lateral surface 60b of the cover member 60, thus shifting of the optical member 70 in a lateral direction can be limited. The second adhesive portions 82 of the adhesive member 80 are preferably filled in the recesses of the cover member 60. Accordingly, the second adhesive portions 82 of the adhesive member 80 are also in contact with the first upward-facing surface 60c and the second inner lateral surfaces 60d respectively, thus, shifting of the optical member 70 in a lateral direction can be limited more efficiently.

In the first embodiment, when viewed from above, the second adhesive portion 82 of the adhesive member 80 is provided near each of the four connecting sides. That is, the second adhesive portion 82 is provided at four locations. Accordingly, shifting of the optical member 70 in a lateral direction can be reliably limited. The locations to provide the second adhesive portion 82 can be appropriately changed according to the shape of the optical member 70. For example, when two second adhesive portions 82 are provided, they are preferably arranged on a diagonal line passing through the center of the optical member 70. Accordingly, the positional shift in the XY direction (a first lateral direction, a second lateral direction) of the optical member 70, and a rotational positional shift of the optical member 70 can be reduced.

For the adhesive member 80, for example, a photocurable resin such as an ultraviolet curable resin can be used. When a photocurable resin is used, the curing time can be appropriately determined by exposure time to light, and the curing can be obtained in a short time. Accordingly, the optical member 70 can be fixed at a predetermined location with good accuracy. In the first embodiment, the first adhesive portion 81 and the second adhesive portion 82 of the adhesive member 80 are made of a same material, but the first adhesive portion 81 and the second adhesive portion 82 may be made of different materials.

Pressing Member 90

The pressing member 90 is used for pressing the optical member 70 to the frame 12. In the first embodiment, a thin metal plate is used for the pressing member 90. With the use of a metal material, a change in the volume of the pressing member 90 due to change in the temperature can be reduced compared to that when a resin is used for the pressing member. The use of a thin metal plate allows for fixing of the pressing member 90 to the frame 12 while deforming the pressing member 90 to some degree. Thus, even when the height and the location of the optical member 70 are different in each of the light emitting devices, the pressing member 90 can be fixed corresponding to the height and the location of the optical member 70 of each of the light emitting devices.

In the first embodiment, as shown in FIG. 1, a single pressing member 90 defining a through-opening so as not to optically interfere with the lens portions of the optical member 70 is used, and this allows easy handling of the pressure member 90.

In the first embodiment, as shown in FIG. 1, the pressing member 90 is fixed to the frame 12 at four locations, which are at both end portions of each of the short-side lateral walls of the frame 12. In other words, the pressing member 90 is fixed to the short-sides of the frame 12 at locations close to the long-sides of the frame 12. Accordingly, movement of the pressing member 90 in a direction parallel to the short-sides of the frame 12 can be limited by the two long-sides of the frame 12. In order to inhibit separation, the pressing member 90 is preferably fixed to the substrate 10 by at least two locations.

The pressing member 90 is designed to have a thickness, for example, in a range of 0.1 mm to 1 mm. With the thickness of 0.1 mm or greater, plastic deformation of the pressing member 90 can be reduced, and with the thickness of 1 mm or less, the pressure member 90 can be fixed with ease.

Second Embodiment

Figure 9:
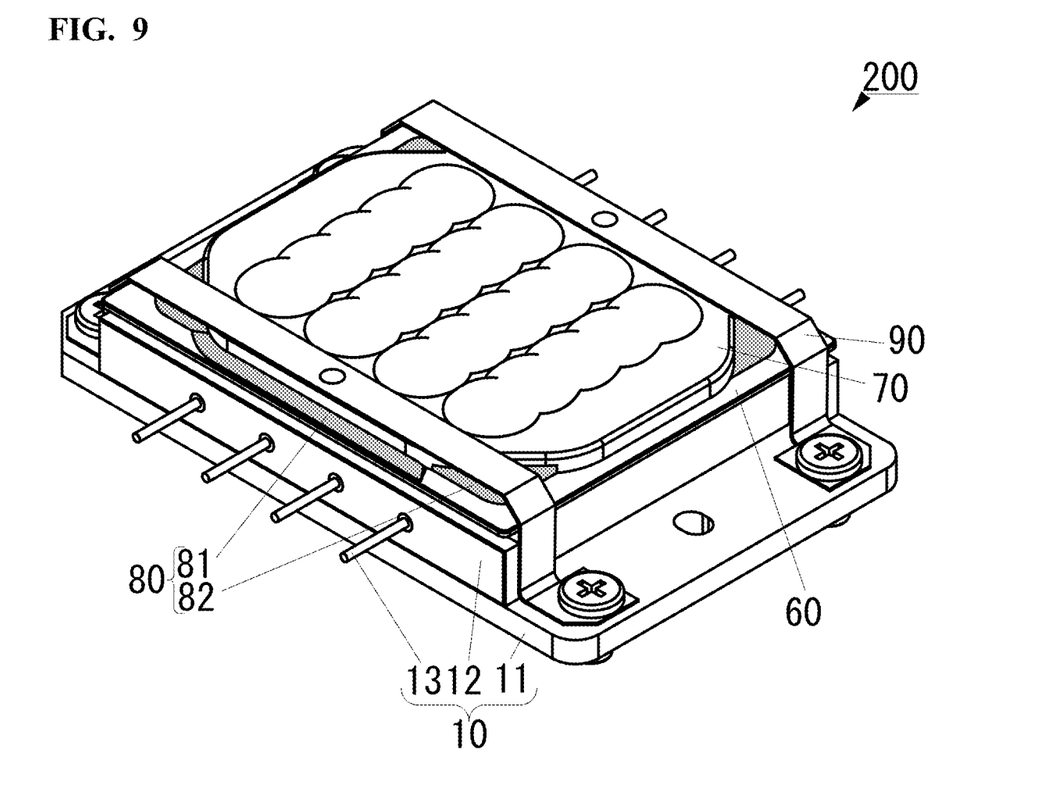
FIG. 9 is a schematic perspective view of a light emitting device according to a second embodiment of the present invention.

In FIG. 9, a schematic perspective view of the light emitting device 200 according to a second embodiment is shown. The semiconductor light emitting element 200 has a substantially similar configuration as that of the light emitting device 100 described in the first embodiment, except for those described below.

In the light emitting device 200, the optical member 70 is fixed to the frame 12 by two pressing members 90. The pressing member 90 is fixed to the base 11 with screws.

In the light emitting device 200, the pressing member 90 is fixed to the base 11 with screws, so that detachment of the pressing member 90 can be further reduced.

Third Embodiment

Figure 10:
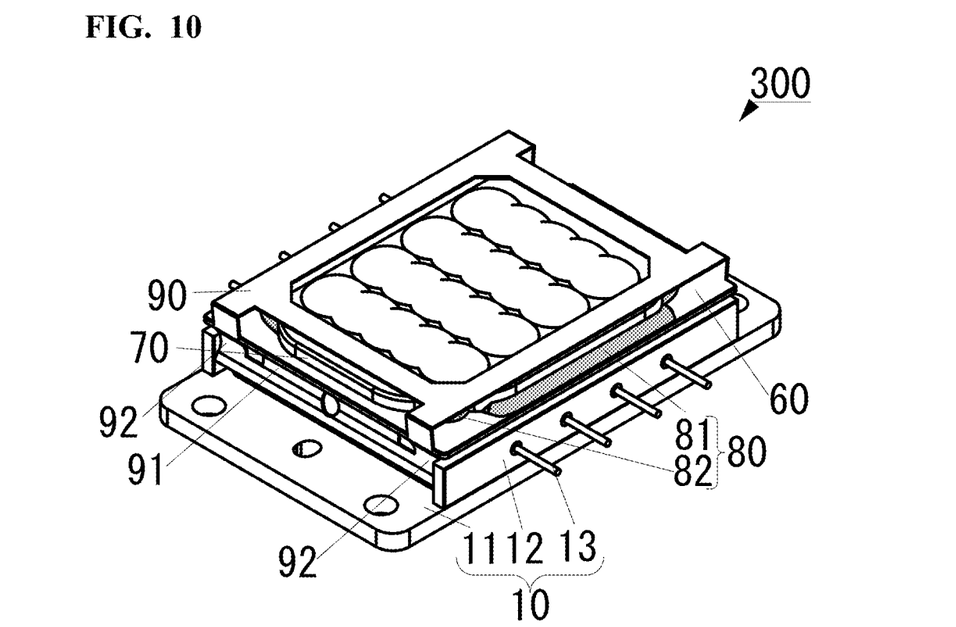
FIG. 10 is a schematic perspective view of a light emitting device according to a third embodiment.

In FIG. 10, a schematic perspective view of a light emitting device 300 according to a third embodiment is shown. The semiconductor light emitting element 300 has a substantially similar configuration as that of the light emitting device 100 described in the first embodiment, except for those described below.

Figure 11:
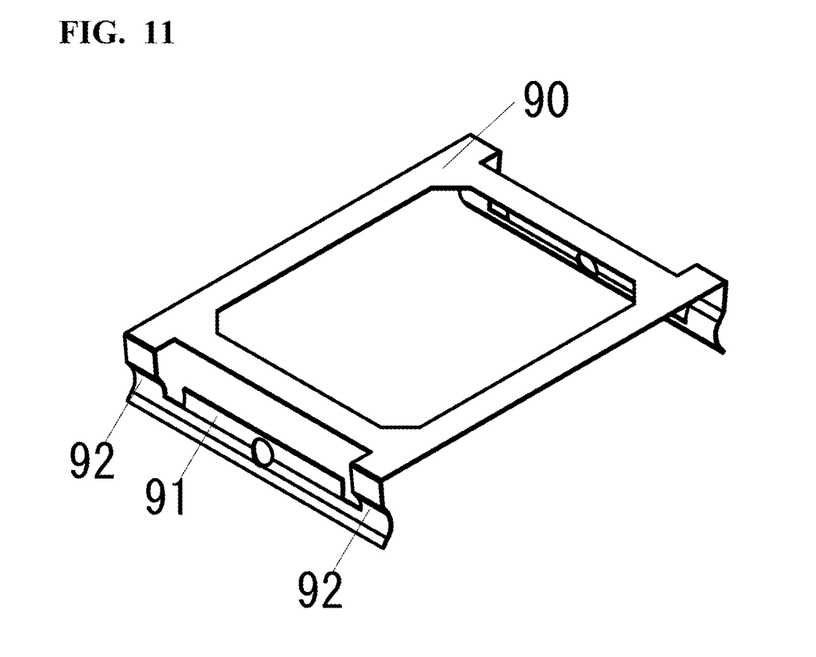
FIG. 11 is a schematic perspective view of a pressing member of the light emitting device shown in FIG. 10.

As shown in FIG. 11, the pressing member 90 includes a stopper 91 in the light emitting device 300. In the schematic cross-sectional view of the light emitting device 300, a top end of the stopper 91 is located inward than portions of the frame 12 that are outwardly bent at upper locations. Accordingly, when the fixing part of the pressing member 90 to the frame 12 is disengaged while using a frame 12 having an outwardly bent portion at upper location, the stopper 91 can be hooked to the frame 12. Thus, detachment of the pressing member 90 can be more easily inhibited. Further, the pressing member 90 shown in FIG. 11 has bent parts 92 near the parts to be fixed to the frame 12, as in the pressing member 90 according to the first embodiment. Thus also, when the pressing member 90 shifts in a lateral direction, the bent parts 92 of the pressing member 92 abut the long sides of the frame 12. Thus, a locational shift in a lateral direction can also be inhibited.

Confirmatory Test

Confirmatory test was performed to determine the effects in the light emitting device 100 according to the first embodiment. In the confirmatory test, a mold release agent was applied on the cover member 60 to create un-adhered state between the cover member 60 and the optical member 70. The details and the results of the confirmatory test will be described below.

A substrate 10 having a base 11 having an upper surface and having a main component of copper, and a frame 12 fixed to the upper surface of the base 11 and having a main component of iron were provided. Then, a plurality of sub-mounts 30 each having a semiconductor laser 20 made of a nitride semiconductor being fixed thereon and corresponding plurality of light-reflecting members 40 were fixed on the upper surface of the base 11 inward of the frame 12. Next, by using seam welding, a cover member 60 was fixed on the upper surface of the frame 12 to cover the through-opening of the frame. At this time, the cover member 60 including the support 61 that has an upper surface 60a, a first inner lateral surface 60b, a first upward-facing surface 60c, a second inner lateral surface 60d, and a second upward-facing surface 60e, and made of a material whose main component is iron was used. Then, the cover member 60 was fixed so that the upper end of the first inner lateral surface 60b is located inward of the upper end of the frame 12 when viewed from above.

Next, a mold release agent was applied on the upper surface 60a, the first inner lateral surface 60b, the first upward-facing surface 60c, the second inner lateral surface 60d, and the second upward-facing surface 60e of the cover member 60. Then, an adhesive member 80 was applied on the upper surface 60a of the cover member 60 located above the two opposite long sides of the frame 12. Subsequently, the optical member 70 was arranged above the substrate 10 so that the optical member 70 is in contact with the adhesive member 80, then the adhesive member 80 was cured to form the first member 81. Then, the adhesive member 80 was applied to be in contact with the lateral surfaces corresponding to the four connecting sides and the bottom surface of the optical member 70, and the upper surface 60a, the first inner lateral surface 60b, the first upward-facing surface 60c, the second inner lateral surface 60d, and the second upward-facing surface 60e, then the adhesive was cured to form the second adhesive portions 82. At this time, a space was created between the cover member 60 and the optical member 70 at locations near the short sides of the optical member 70.

Figure 12:
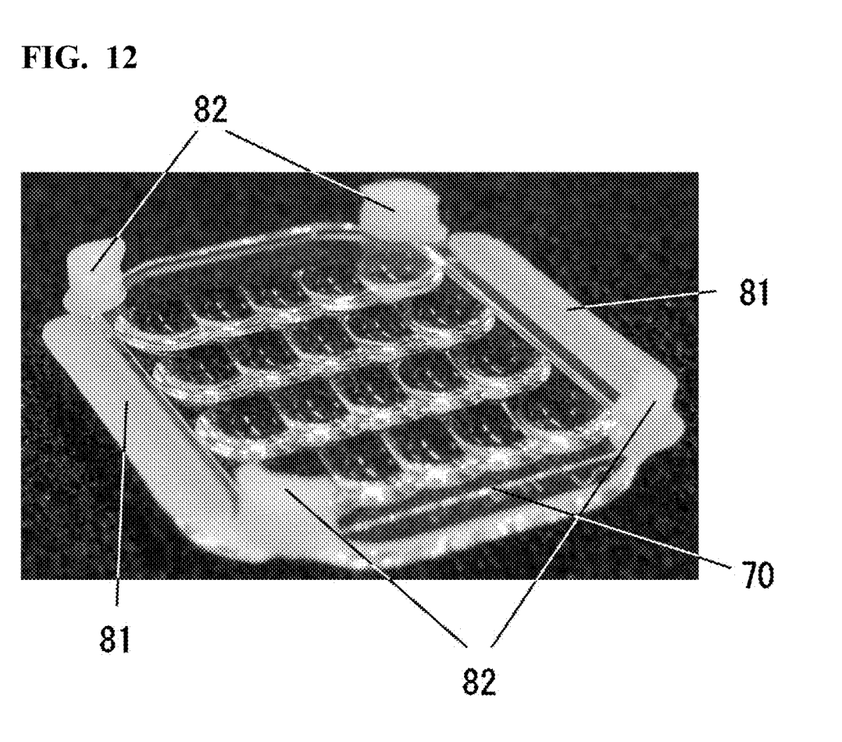
FIG. 12 shows a photograph of the optical member and the adhesive portions, taken during a confirmatory test.

Then, the optical member 70 was removed from the cover member 60. At this time, the adhesive member 80 was attached adhered to the optical member 70, but the adhesive member 80 was not attached to the cover member 60. The optical member 70 removed from the cover member 60 and the adhesive member 80 attached adhered to the optical member 70 are shown in the photograph in FIG. 12. As shown in FIG. 12, the shapes of the second adhesive portions 82 were substantially in conformity to the shape defining the recess of the cover member 60. Subsequently, the optical member 70 was returned to the position. Then, the pressing member 90 made of a thin metal plate was fixed to the frame 12 at four locations near each ends of the two short sides of the frame 12.

It was confirmed that in the light emitting device 100 obtained according the method described above, shifting of the optical member 70 in a lateral direction can be limited by the second adhesive portions 82 of the adhesive member 80, and detachment of the optical member 70 can be inhibited by the pressing member 90.

The light emitting device according to the present disclosure can be used for lighting devices, lighting device for vehicles, etc.

Obviously, numerous modifications and variations of the present invention are possible in light of the above teachings. It is therefore to be understood that within the scope of the appended claims, the invention may be practiced otherwise than as specifically described herein.

What is claimed is:
1. A light emitting device comprising:
a base having an upper surface;
a frame defining a through-opening and fixed to the upper surface of the base;
one or more semiconductor laser elements fixed to the upper surface of the base inward of the frame;

a cover member fixed to the upper surface of the frame so as to cover the through-opening of the frame, the cover member being configured to allow light from the one or more semiconductor laser elements to pass through the cover member;

an optical member fixed to the cover member via an adhesive member, the optical member being configured to allow light that has passed through the cover member to pass through the optical member;

a pressing member pressing the optical member to the frame;

wherein the cover member includes an upper surface located above the upper surface of the frame, a first inner lateral surface extended downward from the upper surface inward of the frame, and a first upward-facing surface extending inward from the first inner lateral surface;

the adhesive member includes:
  one or more first adhesive portions disposed between the upper surface of the cover member and the lower surface of the optical member, and
  two or more second adhesive portions respectively disposed at locations in contact with or spaced apart from the one or more first adhesive portions when viewed from above, in contact with the first inner lateral surface of the cover member and with the lateral surface of the optical member.

2. The light emitting device according to claim 1, wherein:
the optical member has an outer edge that includes:
  a first outer edge located outward of an inner peripheral edge of the cover member that is defined by an upper edge of the first inner lateral surface of the cover member when viewed from above, and
  a second outer edge located inward of the inner peripheral edge of the cover member when viewed from above,
the first adhesive portion of the adhesive member is disposed in a region outward of the inner peripheral edge of the cover member, and
the second adhesive portion of the adhesive member is disposed in a region inward of the inner peripheral edge of the cover member.

3. The light emitting device according to claim 1, wherein, when viewed from above, an outer edge of the optical member includes two opposite relatively long sides and two opposite relatively short sides, and the first adhesive portion of the adhesive member is disposed along each of the two relatively long sides.

4. The light emitting device according to claim 1, wherein:
when viewed from above, the outer periphery of the optical member includes two opposite relatively long sides, two opposite relatively short sides, and four connecting sides, each connecting one of the relatively long sides and one of the relatively short sides,
a portion of each of the four connecting sides is located inward of an inner periphery of the cover member that is defined by an upper end of the first inner lateral surface of the cover member, and
the adhesive member includes four of the second adhesive portions, each located at a portion of one of the four connecting sides, each being in contact with a portion of one of the lateral surfaces of the optical member at a location corresponding to one of the four connecting sides and with one of the first inner lateral surfaces of the cover member.

5. The light emitting device according to claim 1, wherein:
the cover member includes a second inner lateral surface extending upward from the first upward-facing surface and a second upward-facing surface extending inward from the second inner lateral surface, and
the second adhesive portions of the adhesive member are respectively disposed in contact with the first inner lateral surface of the cover member, the first upward-facing surface and the second inner lateral surface, and the lateral surface and the lower surface of the optical member.

6. The light emitting device according to claim 1, wherein the pressing member is formed of a thin metal plate.

7. The light emitting device according to claim 1, wherein a plurality of the semiconductor elements are fixed to the upper surface of the base, and the optical member has a plurality of lens portions corresponding to the respective semiconductor laser elements.

8. The light emitting device according to claim 1, wherein the frame comprises at least two portions protruding outward from the frame and configured to limit shifting of a portion of the pressing member abutting the frame.

9. The light emitting device according to claim 1, wherein the frame is configured to limit shifting of a portion of the pressing member abutting the frame in a first lateral direction, and the two or more second adhesive portions are configured to limit shifting of the optical member in the first lateral direction and a second lateral direction that is perpendicular to the first lateral direction.

10. The light emitting device according to claim 7, wherein the pressing member defines a through-opening so as not to optically interfere with the plurality of lens portions.

11. The light emitting device according to claim 5, wherein the one or more first adhesive portions are not disposed on the first upward-facing surface of the cover member.

* * * * *